United States Patent
Fu et al.

(10) Patent No.: US 8,642,457 B2
(45) Date of Patent: Feb. 4, 2014

(54) METHOD OF FABRICATING SEMICONDUCTOR DEVICE

(75) Inventors: Ssu-I Fu, Kaohsiung (TW); I-Ming Tseng, Kaohsiung (TW); En-Chiuan Liou, Tainan (TW); Shih-Hung Tsai, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 231 days.

(21) Appl. No.: 13/039,315

(22) Filed: Mar. 3, 2011

(65) Prior Publication Data
US 2012/0225545 A1    Sep. 6, 2012

(51) Int. Cl.
*H01L 21/28* (2006.01)

(52) U.S. Cl.
USPC ..... 438/591; 438/275; 438/286; 257/E21.158

(58) Field of Classification Search
USPC .......................................... 438/275, 286, 591
See application file for complete search history.

(56) References Cited

U.S. PATENT DOCUMENTS

| | | | |
|---|---|---|---|
| 5,498,768 A | 3/1996 | Nishitani | |
| 6,806,146 B1 | 10/2004 | Brask | |
| 6,841,484 B2 | 1/2005 | Ying | |
| 7,012,027 B2 | 3/2006 | Perng | |
| 7,030,430 B2 | 4/2006 | Doczy | |
| 7,126,199 B2 | 10/2006 | Doczy | |
| 7,160,767 B2 | 1/2007 | Brask | |
| 7,220,635 B2 | 5/2007 | Brask | |
| 7,381,608 B2 | 6/2008 | Brask | |
| 7,488,656 B2 | 2/2009 | Cartier | |
| 8,008,143 B2 * | 8/2011 | Hsu et al. ................... | 438/183 |
| 2002/0190302 A1 | 12/2002 | Bojarczuk, Jr. | |
| 2004/0007561 A1 | 1/2004 | Nallan | |
| 2005/0275035 A1 | 12/2005 | Mathew | |
| 2007/0117304 A1 | 5/2007 | Hwang | |
| 2008/0157231 A1 | 7/2008 | Wang | |
| 2010/0062592 A1 | 3/2010 | Clark | |
| 2011/0256682 A1 * | 10/2011 | Yu et al. ..................... | 438/287 |
| 2012/0045880 A1 | 2/2012 | Ma | |
| 2012/0175711 A1 * | 7/2012 | Ramachandran et al. .... | 257/383 |

* cited by examiner

*Primary Examiner* — Alexander Ghyka
(74) *Attorney, Agent, or Firm* — Winston Hsu; Scott Margo

(57) ABSTRACT

The present invention provides a method of fabricating a semiconductor device. A substrate is provided. A first region and a second region are defined on the substrate. A first interfacial layer, a sacrifice layer and a sacrifice gate layer are disposed on the first region. The sacrifice layer and the sacrifice gate layer are disposed on the second region of the substrate. Next, a first etching step is performed to remove the sacrifice gate layer in the first region and the second region. Then, a second etching step is performed to remove the sacrifice layer in the first region and the second region to expose the substrate of the second region. Lastly, a second interfacial layer is formed on the substrate of the second region.

20 Claims, 4 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, to a method of simultaneously forming a high-voltage device and a low-voltage device.

2. Description of the Prior Art

With a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals that are suitable for use as the high-k gate dielectric layer are used to replace the conventional poly-silicon gate to be the control electrode.

The conventional metal gate methods are categorized into gate first processes and gate last processes. In a conventional gate first process, the annealing process for forming the source/drain ultra-shallow junction, and the silicide process are performed after forming the metal gate. In the conventional gate last process, a sacrificial gate or a replacement gate is provided and followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

Moreover, integrated circuits (ICs) containing both high-voltage and low-voltage devices such as high/low voltage MOS transistor devices are known in the art. For example, the operation voltage of the low-voltage device is about 0.9V and the operation voltage of the high-voltage device is about 1.8V. In general, the high-voltage device requires a thicker gate dielectric layer. However, whether in gate first processes or gate last processes, the requirement to simultaneously form the high-voltage device with thicker gate dielectric layer and the low-voltage device with thinner gate dielectric layer is seldom considered.

SUMMARY OF THE INVENTION

The present invention therefore provides a method of fabricating a semiconductor device, and more particularly, a method of simultaneously forming a high-voltage transistor and a low-voltage transistor.

The present invention provides a method of fabricating a semiconductor device. A substrate is provided. A first region and a second region are defined on the substrate. A first interfacial layer, a sacrifice layer and a sacrifice gate layer are disposed on the first region of the substrate. The sacrifice layer and the sacrifice gate layer are disposed on the second region of the substrate. Next, a first etching step is performed to remove the sacrifice gate layer in the first region and the second region. Then, a second etching step is performed to remove the sacrifice layer in the first region and the second region to expose the substrate of the second region. Lastly, a second interfacial layer is formed on the substrate of the second region.

The present invention provides a method of fabricating a semiconductor device to substantially form a high-voltage device and a low-voltage device. By using the method provided in the present invention, the thickness of the first interfacial layer can be controlled precisely and the performance of the product can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
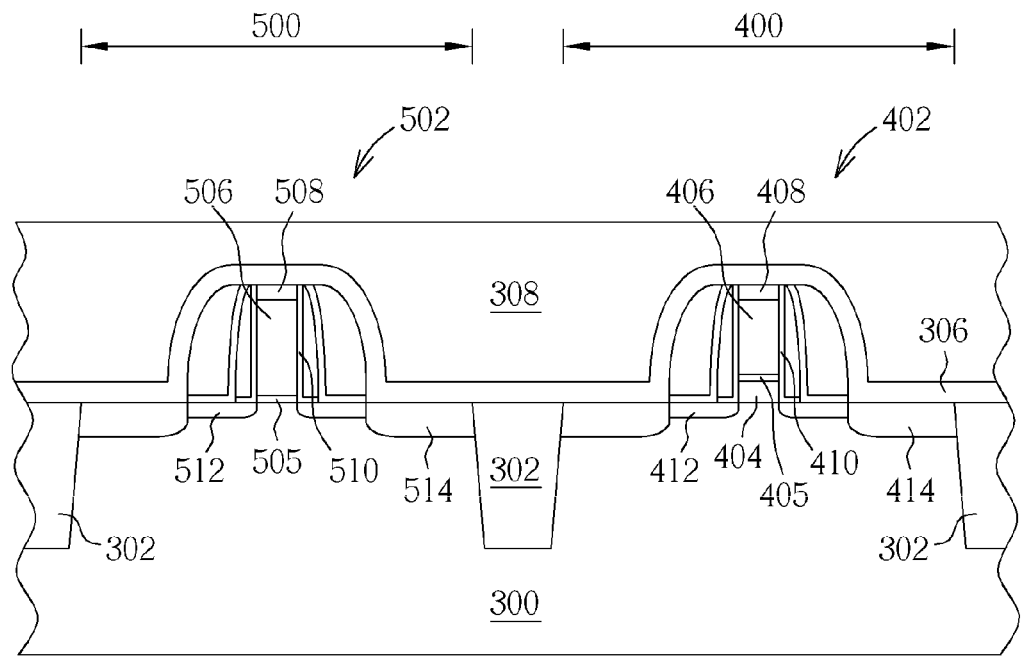
FIG. 1 to FIG. 7 are schematic diagrams of the method of fabricating semiconductor devices in the present invention.

To provide a better understanding of the presented invention, preferred embodiments will be made in detail. The preferred embodiments of the present invention are illustrated in the accompanying drawings with numbered elements.

Please refer to FIG. 1 to FIG. 7, illustrating schematic diagrams of the method of fabricating a semiconductor device in the present invention. First, a substrate 300 is provided, such as a silicon substrate, an epitaxial silicon substrate, a silicon germanium substrate or a silicon-on-insulator (SOI). A plurality of shallow trench isolations (STI) 302 are disposed on the substrate 300. A first region 400 and a second region 500 are defined on the substrate 300. In one preferred embodiment, the first region 400 is a high-voltage device region such as an input/output region which contains high-voltage (1.8V or even higher) MOS transistors. The second region 500 is a low-voltage region such as a core region which contains low-voltage (0.9V or lower) MOS transistors. Next, a high-voltage transistor 402 and a low-voltage transistor 502 are formed on the substrate 300 of the first region 400 and the second region 500 respectively.

As shown in FIG. 1, the high-voltage transistor 402 includes a first interfacial layer 404, a first sacrifice layer 405, a first sacrifice gate 406, a first capping layer 408, a first spacer 410, a first lightly doped drain (LDD) 412 and a first source/drain 414. In one preferred embodiment of the present invention, the first interfacial layer 404 can be a $SiO_2$ layer which is about 30 angstroms. The first sacrifice layer 405 preferably has an etching selectivity with respect to the first interfacial layer 404, the first sacrifice gate 406 and the substrate 300, for example, an etching selectivity substantially higher or equal to 10:1. The first sacrifice layer 405 preferably has a high etching selectivity with respect to the first spacer 410, for example, an etching selectivity substantially higher or equal to 4:1. In one embodiment, the first sacrifice layer 405 includes a high-k material, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), titanium oxide ($TiO_2$), yttrium oxide ($Y_2O_3$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST). In another embodiment, the first sacrifice layer 405 can include metal/metal nitride, such as TiN or TaN, or can include SiN. The first sacrificial gate 406 is a poly-silicon gate. In another embodiment, the first sacrificial gate 406 is a multi-layered gate including a poly-silicon layer, an amorphous silicon layer or a germanium layer. The first capping layer 408 is a SiN layer for example. The first spacer 410 is a single layer including SiN or SiCN, or can be a multi-layered structure including high temperature oxide (HTO), SiN, $SiO_2$, SiCN or SiN formed by hexachlorodisilane ($Si_2Cl_6$) (HCD-SiN). The first LDD 412 and the first source/drain 414 are formed by appropriate implant doping.

The low-voltage transistor 502 includes a second sacrifice layer 505, a second sacrifice gate 506, a second capping layer 508, a second spacer 510, a second LDD 512 and a second source/drain 514. In one preferred embodiment, the high-voltage transistor 402 and the low-voltage transistor 502 has similar components formed in the same fabricating method. That is, the material of the first sacrifice layer 405 and the second sacrifice layer 505 include the same material, and the first sacrifice gate 406 and the second sacrifice gate 506 include the same material. The embodiment of each component in the low-voltage transistor 502 is similar to that of the high-voltage type transistor 402 and is not described repeatedly. However, it is noted that there is no first interfacial layer 404 disposed in the low-voltage transistor 502. That is, the second sacrifice layer 505 in the low-voltage transistor 502 directly contacts the substrate 300. In one embodiment, the high-voltage transistor 402 or the low-voltage transistor 502 can further include other semiconductor structures which are not explicitly shown in FIG. 1, such as a silicide layer. After forming the high-voltage transistor 402 and the low-voltage transistor 502, a contact etch stop layer (CESL) 306 and an inter-layer dielectric (ILD) layer 308 are formed on the substrate 300 to cover the high-voltage transistor 402 and the low-voltage transistor 502.

Figure 2:
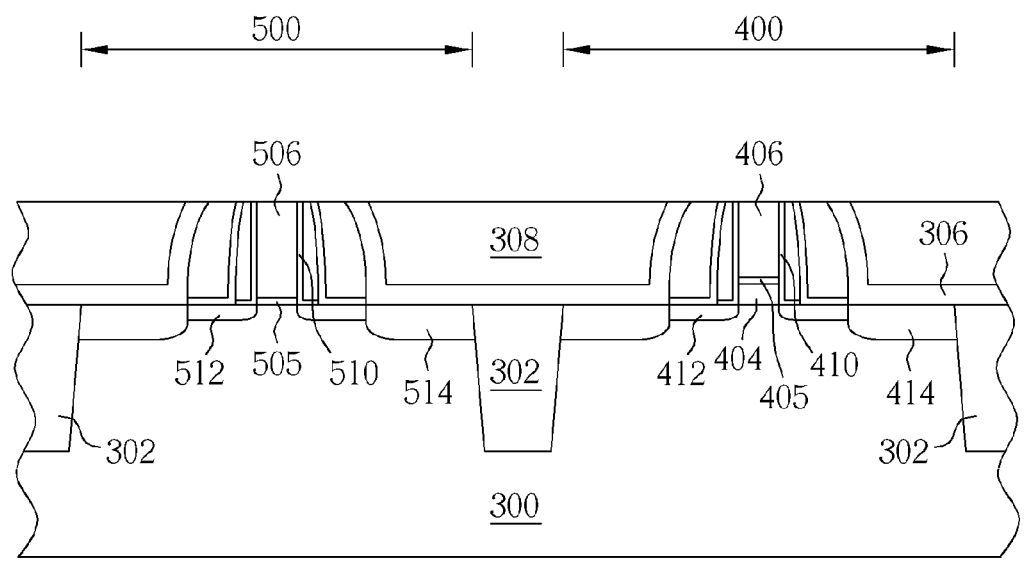

As shown in FIG. 2, a planarization process, such as a chemical mechanical polish (CMP) process or an etching-back process is performed to remove a part of the ILD layer 308, a part of the CESL 306, a part of the first spacer 410, a part of the second spacer 510, and completely remove the first capping layer 408 and the second capping layer 508, until the top surface of the first sacrifice gate 406 and the second sacrifice gate 506 are exposed.

Figure 3:
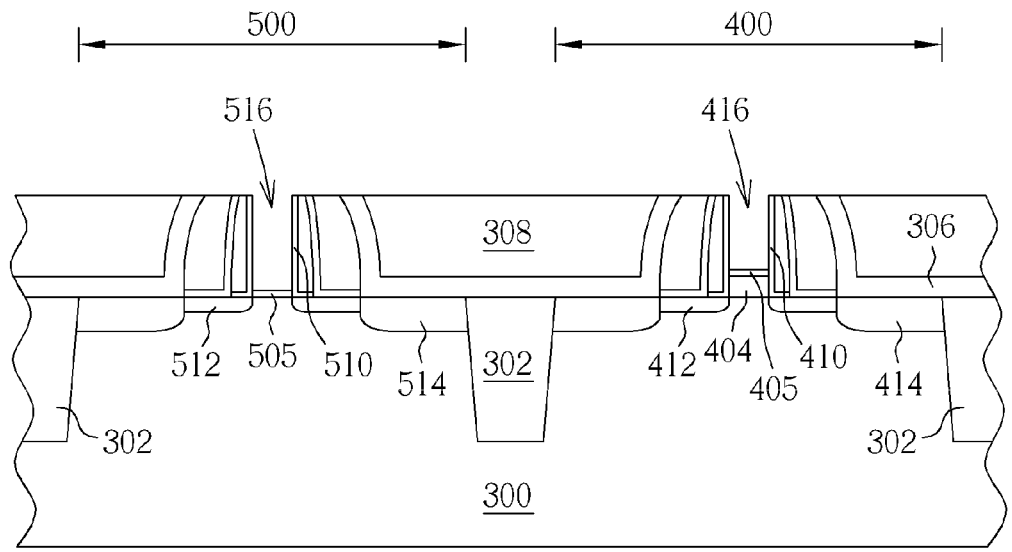

As shown in FIG. 3, a first etching process is performed to remove the first sacrifice gate 406 and the second sacrifice gate 506 to respectively form a first trench 406 and the second trench 506 in the high-voltage transistor 402 and in the low-voltage transistor 502. The first etching process includes a dry etching process and/or a wet process. For example, the dry etching process uses an etchant including HBr, $N_2$ or $NF_3$ or uses an etchant including $BCl_3$ while the wet etching uses tetramethyl ammonium hydroxide (TMAH). In another embodiment, the etching recipe of the first etching process can be adjusted according to the materials of the first sacrifice gate 406 and the second sacrifice gate 506. Since the first sacrifice layer 405 and the second sacrifice layer 505 have a high etching selectivity with respect to the first sacrifice gate 406 and the second sacrifice gate 506, the first etching process stops on the first sacrifice layer 405 and the second sacrifice layer 505. That is, the first sacrifice layer 405 and the second sacrifice layer 505 are used as etching stop layers during the first etching process.

Figure 4:
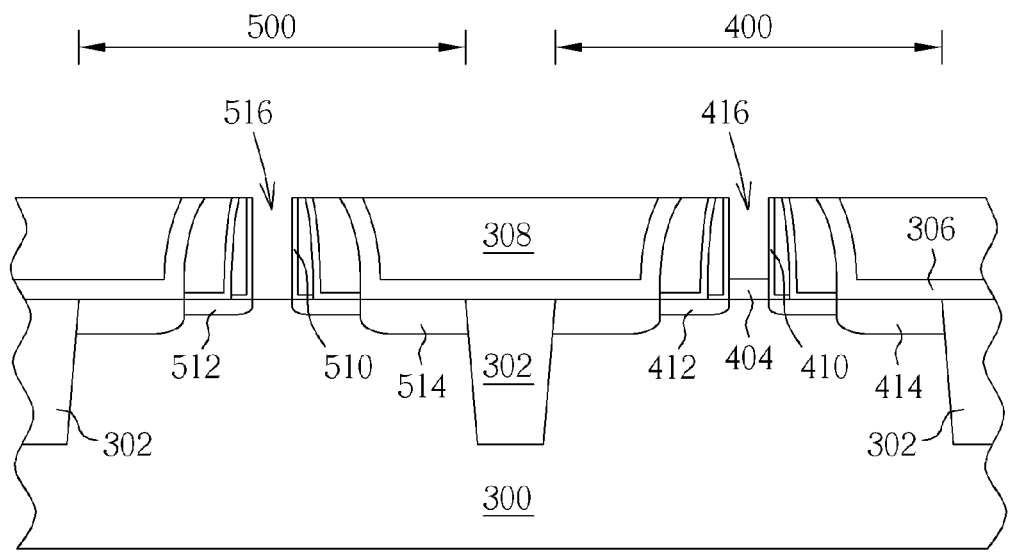

As shown in FIG. 4, a second etching process is performed to remove the first sacrifice layer 405 and the second sacrifice layer 505, to expose the first interfacial layer 404 in the first trench 416 of the high-voltage transistor 402, and the substrate 300 in the second trench 516 of the low-voltage transistor 502. In one preferred embodiment, the second etching process includes a wet etching process wherein the recipe is adjusted according to the materials of the first sacrifice layer 405 and the second sacrifice layer 505. For example, when the first sacrifice layer 405 and the second sacrifice layer 505 include high-k material, the second etching process includes using an etchant containing HF/HCl. When the first sacrifice layer 405 and the second sacrifice layer 505 include TiN or TaN, the second etching process includes using an etchant containing $NH_4OH/H_2O_2/H_2O$. When the first sacrifice layer 405 and the second sacrifice layer 505 include SiN, the second etching process includes using an etchant containing $H_3PO_4$. Since the first sacrifice layer 405 and the second sacrifice layer 505 have a high etching selectivity with respect to the first interfacial layer 404 in the first trench 416 and substrate 300 in the second trench 516, after the second etching process, the substrate 300 in the second region 500 can be exposed without removing the first interfacial layer 404 in the first region 400, thereby retaining the thickness of the first interfacial layer 404.

Figure 5:
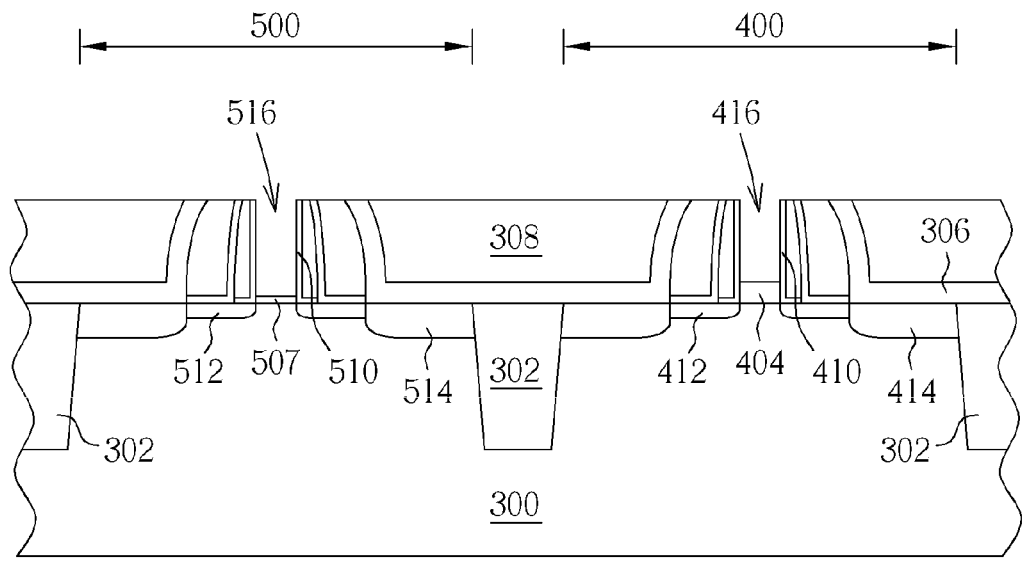

As shown in FIG. 5, a second interfacial layer 507 is formed in the second trench 516. In one embodiment, the method includes using a thermal oxidation process to form the second interfacial layer 507 containing $SiO_2$. In one preferred embodiment, the thickness of the second interfacial layer 507 is less than the first interfacial layer 404. For example, the second interfacial layer 507 is about 10 angstrom and the first interfacial layer 404 is about 30 angstrom. Since there is already the first interfacial layer 404 containing $SiO_2$ covering on the substrate 300 in the first trench 416, the second interfacial layer 507 is not formed on the substrate 300 in the first trench 416. That is, the thickness of the first interfacial layer 404 does not change during the thermal oxidation process.

Figure 6:
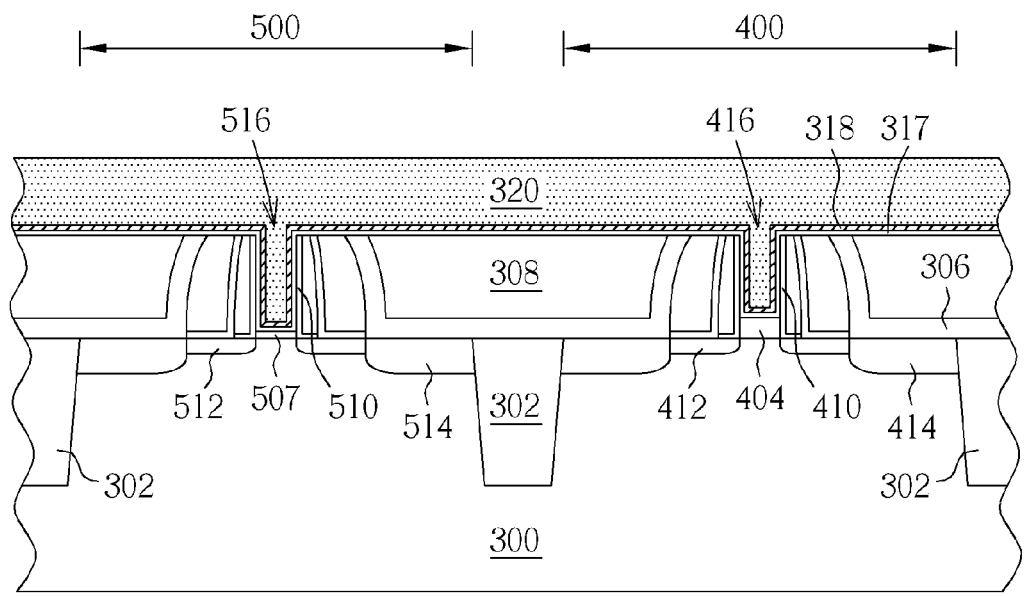

As shown in FIG. 6, a high-k dielectric layer 317, a work function metal layer 318 are formed on the substrate 300 to conformally fill into the first trench 416 and the second trench 516. However, the first trench 416 and the second trench 516 are not completely filled with the work function metal layer 318. Subsequently, a low-resistive metal layer 320 is formed on the substrate 300 to completely fill into the first trench 416 and the second trench 516. The high-k dielectric layer 317 includes the above mentioned high-k material. The material of the work function metal layer 318 depends on the electrical property of the low-voltage transistor 502, for example, the work function metal layer 318 can include TiAl, ZrAl, WAl, TaAl, HfAl, TiN or TaC, but is not limited thereto. The low-resistive metal layer 320 includes Al, Ti, Ta, W, Nb, Mo, Cu, TiN, TiC, TaN Ti/W or Ti/TiN, but is not limited thereto. In one embodiment, a single or a plurality barrier layers such as a TiN layer or a TaN layer can be formed between the high-k dielectric layer 317 and the work function metal layer 318, or between the work function metal layer 318 and the low-resistive metal layer 320.

Figure 7:
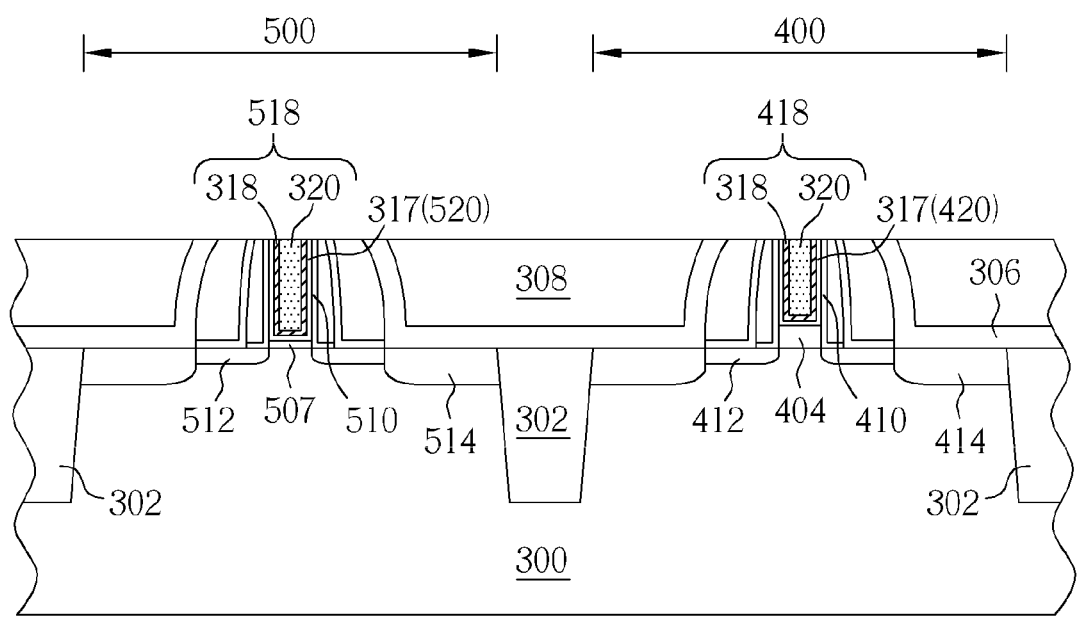

As shown in FIG. 7, a planarization process is performed to simultaneously remove the high-k dielectric layer 317, the work function metal layer 318 and the low-resistive metal layer 320 outside the first trench 416 and the second trench 516. Thus, the high-k dielectric layer 317 and the work function metal layer 318 form a U-shaped cross-section in the first trench 416 and the second trench 516. The work function metal layer 318 and the low-resistive metal layer 326 in the first trench 416 together form a first metal gate 418 of the high-voltage transistor 402. The high-k dielectric layer 317 and the first interfacial layer 404 together form the first gate dielectric layer 420 of the high-voltage transistor 402. In the meanwhile, the work function metal layer 318 and the low-resistive metal layer 326 in the second trench 416 together form a second metal gate 518 of the low-voltage transistor 502. The high-k dielectric layer 317 and the second interfacial layer 507 together form the second gate dielectric layer 520 of the low-voltage transistor 502. It is noted that the high-voltage transistor 402 contains a first gate dielectric layer 420 which is thicker than the second gate dielectric layer 520 of the low-voltage transistor 502. The high-voltage transistor 520 is operated under a voltage greater or equal to 18V.

In light of above, the present invention provides a method of fabricating a semiconductor device to substantially form a high-voltage device having a metal gate and a low-voltage device having a metal gate. Due to using appropriate material in the first sacrifice layer and the second sacrifice layer, the first sacrifice layer and the second sacrifice layer can be used as etch stop layers during the first etching process. Moreover, the substrate of the low-voltage transistor can be exposed during the second etching process but retain the first interfacial layer of the high-voltage transistor. Accordingly, the second interfacial layer can be formed only on the substrate of the low-voltage transistor without affecting the thickness of the first interfacial layer. By using the method provided in the present invention, the thickness of the first interfacial layer can be controlled precisely and the performance of the product can be improved.

Those skilled in the art will readily observe that numerous modifications and alterations of the device and method may be made while retaining the teachings of the invention.

What is claimed is:

1. A method of fabricating a semiconductor device, comprising:
providing a substrate, wherein a first region and a second region are defined on the substrate, a first interfacial layer, a sacrifice layer and a sacrifice gate layer are disposed in sequence on the substrate of the first region, the sacrifice layer and the sacrifice gate layer are disposed in sequence on the substrate of the second region;
performing a first etching process to remove the sacrifice gate in the first region and the second region;
performing a second etching process to remove the sacrifice layer in the first region and the second region to expose the substrate only in the second region; and
forming a second interfacial layer on the substrate in the second region.

2. The method of fabricating a semiconductor device according to claim 1, wherein the sacrifice layer has an etching selectivity substantially greater than 10:1 with respect to the sacrifice gate layer, the first interfacial layer and the substrate.

3. The method of fabricating a semiconductor device according to claim 1, wherein a first spacer is disposed on a sidewall of the first interfacial layer, the sacrifice layer and the sacrifice gate in the first region, and a second spacer is disposed on a sidewall of the sacrifice layer and the sacrifice gate in the second region, wherein the sacrifice layer has an etching selectivity substantially greater than 4:1 with respect to the first spacer and the second spacer.

4. The method of fabricating a semiconductor device according to claim 3, wherein the first spacer and the second spacer comprise SiN.

5. The method of fabricating a semiconductor device according to claim 1, wherein the sacrifice layer comprises a high-k material.

6. The method of fabricating a semiconductor device according to claim 5, wherein the high-k material comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), titanium oxide ($TiO_2$), yttrium oxide ($Y_2O_3$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST).

7. The method of fabricating a semiconductor device according to claim 5, wherein the second etching process comprises using an etchant comprising HF and HCl.

8. The method of fabricating a semiconductor device according to claim 1, wherein the sacrifice layer comprises TiN or TaN.

9. The method of fabricating a semiconductor device according to claim 8, wherein the second etching process comprises using an etchant comprising $NH_4OH$, $H_2O_2$ and $H_2O$.

10. The method of fabricating a semiconductor device according to claim 1, wherein the sacrifice layer comprises SiN.

11. The method of fabricating a semiconductor device according to claim 10, wherein the second etching process comprises using an etchant comprising $H_3PO_4$.

12. The method of fabricating a semiconductor device according to claim 1, wherein the substrate comprises a silicon substrate, an epitaxial silicon substrate, a silicon germanium substrate or a silicon-on-insulator (SOI).

13. The method of fabricating a semiconductor device according to claim 1, wherein the first interfacial layer comprises $SiO_2$.

14. The method of fabricating a semiconductor device according to claim 1, wherein the sacrifice gate layer comprises poly-silicon.

15. The method of fabricating a semiconductor device according to claim 1, wherein the sacrifice layer is used as an etching stop layer during the first etching process.

16. The method of fabricating a semiconductor device according to claim 1, wherein after the second etching process, the first interfacial layer is still disposed on the substrate in the first region.

17. The method of fabricating a semiconductor device according to claim 1, wherein the second interfacial layer comprises $SiO_2$.

18. The method of fabricating a semiconductor device according to claim 1, wherein the step of forming the second interfacial layer comprises a thermal oxidation process.

19. The method of fabricating a semiconductor device according to claim 1, further comprising forming a high-k layer and a metal layer on the first interfacial layer in the first region and the second interfacial layer in the second region.

20. A method of fabricating a semiconductor device, comprising:
providing a substrate, wherein a first region and a second region are defined on the substrate, a first interfacial layer, a sacrifice layer and a sacrifice gate layer are disposed in sequence on the substrate of the first region, the sacrifice layer and the sacrifice gate layer are disposed in sequence on the substrate of the second region;
performing a first etching process to remove the sacrifice gate in the first region and the second region;
performing a second etching process to completely remove the sacrifice layer in the first region and the second region to expose the substrate in the second region, wherein the substrate of the first region is not exposed; and
forming a second interfacial layer on the substrate in the second region.

* * * * *